US012593148B2

(12) United States Patent
Zhou et al.

(10) Patent No.: US 12,593,148 B2
(45) Date of Patent: Mar. 31, 2026

(54) ACTIVE PIXEL CIRCUIT, IMAGE SENSOR, AND ELECTRONIC DEVICE

(71) Applicant: WUHAN XINXIN SEMICONDUCTOR MANUFACTURING CO., LTD., Wuhan (CN)

(72) Inventors: Jun Zhou, Wuhan (CN); Peng Sun, Wuhan (CN); Daohong Yang, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 134 days.

(21) Appl. No.: 18/555,789

(22) PCT Filed: May 31, 2021

(86) PCT No.: PCT/CN2021/097488
§ 371 (c)(1),
(2) Date: Oct. 17, 2023

(87) PCT Pub. No.: WO2022/227221
PCT Pub. Date: Nov. 3, 2022

(65) Prior Publication Data
US 2024/0205564 A1    Jun. 20, 2024

(30) Foreign Application Priority Data
Apr. 29, 2021    (CN) .......................... 202110476254.0

(51) Int. Cl.
*H04N 25/77*    (2023.01)
*H10F 39/00*    (2025.01)
*H10F 39/18*    (2025.01)

(52) U.S. Cl.
CPC ......... *H04N 25/77* (2023.01); *H10F 39/8037* (2025.01); *H10F 39/18* (2025.01)

(58) Field of Classification Search
CPC ........ H04N 25/71; H04N 25/76; H04N 25/77; H10F 39/18; H10F 39/8037; H10F 39/80373; H10F 39/80377
See application file for complete search history.

(56) References Cited

U.S. PATENT DOCUMENTS 6,307,805 B1   10/2001   Andersen et al.
2001/0005613 A1   6/2001   Akiyama
(Continued)

FOREIGN PATENT DOCUMENTS

CN   1652344 A   8/2005
CN   1739198 A   2/2006
(Continued)

*Primary Examiner* — Daniel M Pasiewicz
(74) *Attorney, Agent, or Firm* — MUNCY, GEISSLER, OLDS & LOWE, P.C.

(57) ABSTRACT
An active pixel circuit, an image sensor and an electronic device are disclosed. The active pixel circuit has a photo-diode and at least three MOS transistors. At least one of the MOS transistors serves as a transfer transistor, and at least another one of the MOS transistors serves as a reset transistor. Moreover, at least yet another one of the MOS transistors serves as other transistor(s). The transfer transistor has a higher threshold voltage and smaller off-state leakage current under operating voltage than each other MOS transistor. With this design, the high-threshold, low-leakage characteristics of the transfer transistor reduce storage distortion of the photodiode and signal readout distortion, resulting in less read noise and lower power consumption of the active pixel circuit. Meanwhile, the low-threshold, high-leakage (i.e., high-on-current) characteristics of the other MOS transistors impart an increased reading speed of the active pixel circuit.

18 Claims, 2 Drawing Sheets

(56)           References Cited

U.S. PATENT DOCUMENTS

| | | |
|---|---|---|
| 2002/0118289 A1 | 8/2002 | Choi |
| 2005/0001277 A1 | 1/2005 | Rhodes |
| 2006/0131592 A1* | 6/2006 | Rhodes ................. H10F 39/014 |
| | | 257/82 |
| 2007/0145239 A1* | 6/2007 | Mheen ................... H04N 25/63 |
| | | 348/E3.029 |
| 2010/0314667 A1 | 12/2010 | Nozaki et al. |
| 2020/0404199 A1 | 12/2020 | Boukhayma |

FOREIGN PATENT DOCUMENTS

| | | | |
|---|---|---|---|
| CN | 1819238 | A | 8/2006 |
| CN | 1819244 | A | 8/2006 |
| CN | 1835245 | A | 9/2006 |
| CN | 101164334 | A | 4/2008 |
| CN | 101221967 | A | 7/2008 |
| CN | 103152529 | A | 6/2013 |
| CN | 109728010 | A | 5/2019 |
| CN | 110176467 | A | 8/2019 |
| JP | H448775 | A | 2/1992 |
| JP | 201511140 | A | 1/2015 |

* cited by examiner

ACTIVE PIXEL CIRCUIT, IMAGE SENSOR, AND ELECTRONIC DEVICE

TECHNICAL FIELD

The present invention relates to the field of active pixel image sensor technology, and in particular to an active pixel circuit, an image sensor and an electronic device.

BACKGROUND

A CMOS image sensor may be a passive pixel sensor or an active pixel sensor. The passive pixel sensor includes a photodiode consisting of a PN junction and a row select transistor. Despite a high fill factor and quantum efficiency of this simple structure, it is not suitable for applications requiring high-speed reading or high imaging quality due to significant read noise. The active pixel sensor includes two or more transistors (e.g., a reset transistor, a source follower transistor, a transfer transistor, a row select transistor, etc.) and a photodiode. This can reduce read noise by means of correlated double sampling (CDS), making it currently the mainstream image sensor technology for large-scale commercial applications.

However, due to a relatively large number of transistors in the active pixel sensors, only slight variations in transistor size would lead to read noise performance not complying with the circuit's high-speed requirements.

SUMMARY OF THE INVENTION

It is the objective of the present invention to provide an active pixel circuit, an image sensor and an electronic device with reduced read noise and an increased reading speed and hence improved performance.

To this end, the present invention provides an active pixel circuit including a photodiode and at least three MOS transistors, at least one of the MOS transistors serving as a transfer transistor, at least another one of the MOS transistors serving as a reset transistor, at least yet another one of the MOS transistors serving as the other transistor(s), the transfer transistor connected to the photodiode and configured to transmit a photoelectric signal from the photodiode, the reset transistor connected to a terminal of a respective one of the transfer transistor(s) for outputting the photoelectric signal and configured to reset the active pixel circuit, wherein each transfer transistor has a higher threshold voltage and smaller off-state leakage current under operating voltage than each other MOS transistor.

Optionally, the threshold voltage of each reset transistor may be higher than that of each other MOS transistor, and the off-state leakage current under operating voltage of each reset transistor may be smaller than that of each other MOS transistor. Alternatively, the threshold voltage of each reset transistor may be lower than that of each transfer transistor and the off-state leakage current under operating voltage of each reset transistor may be greater than that of each transfer transistor.

Optionally, at least one of the other MOS transistors may serve as a source follower transistor, which is connected to the terminal of the respective transfer transistor for outputting the signal and configured to buffer the signal from the transfer transistor. Alternatively or additionally, at least one of the other MOS transistors may serve as a row select transistor, which is connected to the source follower transistor and configured to enable the signal from the source follower transistor to be read out.

Optionally, the transfer transistor, the reset transistor, the source follower transistor and the row select transistor may all be NMOS transistors.

Optionally, the transfer transistor, the reset transistor, the source follower transistor and the row select transistor may all be PMOS transistors.

Optionally, an anode of the photodiode may be grounded, with a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, a drain of the reset transistor and a drain of the source follower transistor both connected to an operating voltage signal, a source of the source follower transistor connected to a drain of the row select transistor, a gate of the row select transistor connected to a row select voltage signal and a source of the row select transistor providing a signal output terminal of the active pixel circuit.

Optionally, at least one of the other MOS transistors may serve as an exposure control transistor, which is connected to the respective transfer transistor and configured to provide global exposure capabilities.

Optionally, the transfer transistor, the reset transistor, the source follower transistor, the row select transistor and the exposure control transistor may all be NMOS transistors.

Optionally, an anode of the photodiode may be grounded, with a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, drains respectively of the reset transistor, the source follower transistor and the exposure control transistor all connected to an operating voltage signal, a source of the source follower transistor connected to a drain of the row select transistor, a gate of the row select transistor connected to a row select voltage signal, a source of the row select transistor providing a signal output terminal of the active pixel circuit and a gate of the exposure control transistor connected to an exposure control signal.

Optionally, the transfer transistor, the reset transistor, the source follower transistor and the row select transistor may all have an operating voltage of between 1.62 V and 3.7 V.

Optionally, the active pixel circuit may further include a floating diffusion region connected to the terminal of the transfer transistor for outputting the signal and configured to inductively generate a corresponding voltage signal from an amount of charge output from the transfer transistor.

Optionally, the transfer transistor may have the threshold voltage of between 0.4 V and 1.0 V.

Optionally, the threshold voltage of each other MOS transistor may lie between 0.2 V and 0.8 V.

Optionally, the off-state leakage current under operating voltage of the transfer transistor may lie between 0.1 pA/μm and 0.1 nA/μm. The off-state leakage current under operating voltage of each other transistor may lie between 1 pA/μm and 100 nA/μm.

On the basis of the same inventive concept, the present invention also provides an image sensor a pixel array and a control circuit, the pixel array including at least one active pixel circuit as defined above, the control circuit connected to gates of corresponding MOS transistors in each active pixel circuit and configured to turn on or deactivate the corresponding MOS transistors in each active pixel circuit.

On the basis of the same inventive concept, the present invention also provides an electronic device including an image sensor as disclosed herein.

Compared with the prior art, the present invention offers at least one of the following benefits:

1. The active pixel circuit has one photodiode and at least three MOS transistors. At least one of the MOS transistors serves as a transfer transistor, at least another one of the MOS transistors as a reset transistor, and at least yet another one of the MOS transistors as other transistor(s). The transfer transistor has both a higher threshold voltage and a smaller leakage current than the other MOS transistors. With this design, the high-threshold, low-leakage (i.e., with a small off-state leakage current under operating voltage) of the transfer transistor can reduce storage distortion of the photodiode and signal readout distortion, resulting in less read noise and lower power consumption of the active pixel circuit. Meanwhile, the low-threshold, high-leakage (with a large off-state leakage current under operating voltage) characteristics of the other MOS transistors impart an increased reading speed of the active pixel circuit.

2. Compared with existing active pixel circuit, since only the MOS transistor(s) serving as the transfer transistor and/or the reset transistor may be replaced with high-threshold, low-leakage MOS transistor(s), the imaging quality and reading speed of the image sensor can be improved, while taking into amount its manufacturing, implementation and retrofit cost.

DETAILED DESCRIPTION

Figure 1:
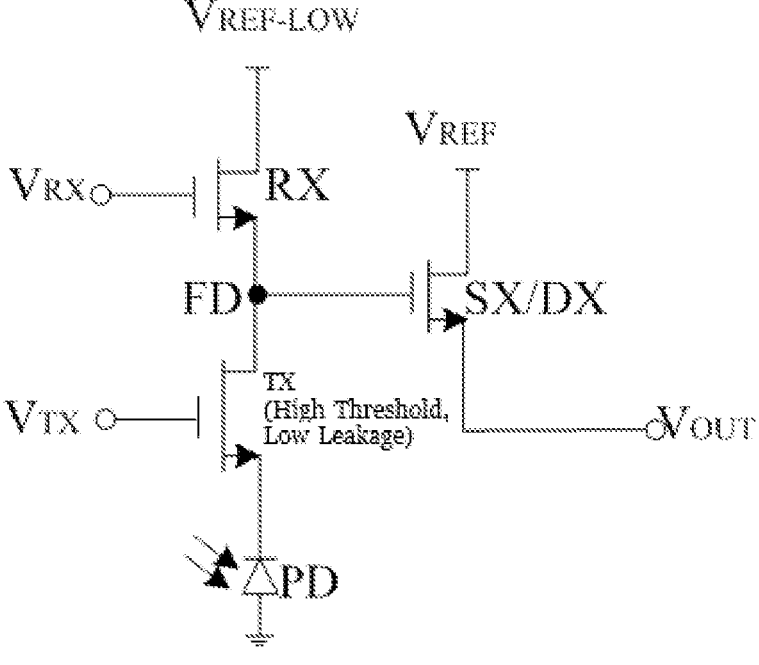
FIG. 1 is a schematic diagram illustrating the structure of an active pixel circuit according to an embodiment of the present invention.

A conventional 4T active pixel circuit for use in an existing CMOS image sensor typically includes a transfer transistor, a reset transistor, a source follower transistor and a row select transistor. The four transistors (i.e., 4T) are typically chosen as four identical NMOS transistors. Due to fabrication variations, four transistors have slightly different sizes, but have the same operating voltage, threshold voltage and off-state leakage current under the operating voltage.

The existing CMOS image sensor typically employs a correlated double sampling (CDS) technique, which samples a photoelectric signal output from a single photodiode through one and the same path (known as the common readout path) in each sampling period twice (usually once at the beginning of exposure integration time of the photodiode PD, and once at the end of exposure integration time of the photodiode PD) at an interval that is much shorter than the time constant C*Ron (Ron is the on-resistance of the reset transistor). The two output levels sampled in this way will have comparable noise voltage components. This, coupled with the fact that the two sampling times are correlated, enables effective amplitude of the signal to be determined simply by performing a subtraction operation on the two sampled values to substantially eliminate interference of, for example, fixed-pattern noise from the common readout path and thermal noise introduced by the reset and transfer transistors.

The inventors have found through research that, in the above discussed 4T active pixel circuit, when the sampling occurs in an off-state of the transfer transistor, some electrons from the photodiode will flow into a floating diffusion region (causing random noise), making further read noise reduction impossible for the CMOS image sensor. Moreover, the faster the reading speed of the CMOS image sensor, the higher the read noise. That is, the read noise performance of the CMOS image sensor does not comply with the high-speed requirements of the circuit. This is because the four MOS transistors in the 4T active pixel circuit have substantially identical electrical properties such as operating voltage, threshold voltage and off-state leakage current under operating voltage despite slight size variations.

This problem is also seen in 3T active pixel circuits, 5T active pixel circuits or even active pixel circuits incorporating more MOS transistors for use in CMOS image sensors.

In view of this, the present invention principally seeks to enable read noise performance of a CMOS image sensor that is compared with a reading speed of the circuit while taking in account manufacturing cost, through specifically customizing pass, reset, source follower and row select transistors in the image sensor. Specifically, among the MOS transistors in an existing active pixel circuit as described above, the one used as the transfer transistor is replaced with a high-threshold, low-leakage (i.e., with a low off-state leakage current under operating voltage) MOS transistor, and all the others are replaced with a low-threshold or regular-threshold, high-leakage (i.e., with a high off-state leakage current under operating voltage, which corresponds to a large on-current). Alternatively, among the MOS transistors in the existing active pixel circuit, the ones used respectively as the pass and reset transistors are replaced with high-threshold, low-leakage (i.e., with a low off-state leakage current under operating voltage) MOS transistors, and all the others are replaced with low-threshold or regular-threshold, high-leakage (i.e., with a high off-state leakage current under operating voltage, which corresponds to a large on-current) MOS transistors. That is, in the active pixel circuit of the present invention, the transfer transistor has a higher threshold voltage and lower off-state leakage current than all the other MOS transistors.

In this way, through imparting high-threshold, low-leakage characteristics to the transfer transistor, the problem that some electrons flow from a photodiode into a floating diffusion region due to off-state leakage of the transfer transistor can be avoided. This can ensure that read noise is contributed only by the common readout path during sampling in an off-state of the transfer transistor, enabling the elimination of interference of, for example, fixed-pattern noise from the common readout path, thermal noise introduced by the reset and transfer transistors, as well as random noise generated as a consequence of some electrons flowing from a photodiode into a floating diffusion region during sampling in an off-state of the transfer transistor. In this way, storage distortion of the photodiode and read-out distortion of the common readout path can be ameliorated, resulting in reduced read noise of the CMOS image sensor. Moreover, the low- or regular-threshold, high-on-current characteristics of the other MOS transistors impart an increased reading speed to the circuit. Thus, the read noise performance of the CMOS image sensor complies with high-speed requirements of the circuit.

The present invention also provides an image sensor including a pixel array and a control circuit. The pixel array includes at least one active pixel circuit as disclosed herein. The control circuit is connected to gates of MOS transistors in each active pixel circuit in order to be able to turn on (i.e., bring it to a turned-on state, or briefly on-state) or off (i.e., bring it to a turned-off state, or briefly off-state) any of the MOS transistors in the active pixel circuit as needed.

The present invention also provides an electronic device including an image sensor as disclosed herein and an image processor for processing an image captured by the image sensor.

The present invention will be described in detail below with reference to the accompanying drawings and to specific embodiments. Advantages and features of the invention will become more apparent from the following description. It is noted that the figures are provided in a very simplified form not necessarily drawn to exact scale for the only purpose of facilitating easy and clear description of the disclosed embodiments.

Referring to FIG. 1, in one embodiment of the present invention, there is provided a 3T active pixel circuit having a photodiode PD, a transfer transistor TX, a reset transistor RX and a multiplexed transistor SX/DX.

Optionally, the transfer transistor TX, the reset transistor RX and the multiplexed transistor SX/DX may be all NMOS or PMOS transistors. In case of the transfer transistor TX, the reset transistor RX and the multiplexed transistor SX/DX all being NMOS transistors, an anode of the photodiode PD is grounded, and a cathode of the photodiode PD is connected to a source of the transfer transistor TX. A drain of the transfer transistor TX is connected to a source of the reset transistor RX and a gate of the multiplexed transistor SX/DX. A gate of the transfer transistor TX is connected to a control voltage signal $V_{TX}$, and a drain of the reset transistor RX is connected to a lower reference voltage signal $V_{REF-LOW}$. A drain of the multiplexed transistor SX/DX is connected to a reference voltage signal $V_{REF}$, which is generally higher than an operating voltage signal $V_{DD}$ of the system. A gate of the reset transistor RX is connected to a reset voltage signal $V_{RX}$, and a source of the multiplexed transistor SX/DX provides a signal output terminal of the 3T active pixel circuit.

The transfer transistor TX is chosen as a high-threshold, low-leakage MOS transistor, and both the reset transistor RX and the multiplexed transistor SX/DX are chosen as low-threshold or regular-threshold, high on-state current MOS transistors. That is, the transfer transistor TX has a higher threshold voltage than the reset transistor RX and the multiplexed transistor SX/DX and a smaller off-state leakage current under operating voltage than the reset transistor RX and the multiplexed transistor SX/DX. Moreover, both the reset transistor RX and the multiplexed transistor SX/DX have an on-current greater than the transfer transistor TX.

As an example, the transfer transistor TX, the reset transistor RX and the multiplexed transistor SX/DX may all operate at a voltage of 1.62-3.7 V, and the reset transistor RX and the multiplexed transistor SX/DX may be identical MOS transistors with essentially or exactly the same operating voltage, threshold voltage and off-state leakage current under operating voltage except for only possible slight size differences due to fabrication variations.

Optionally, the transfer transistor TX may have a threshold voltage of between 0.4 V and 1.0 V.

Optionally, the reset transistor RX and the multiplexed transistor SX/DX may both have a threshold voltage of between 0.2 V and 0.8 V.

Optionally, the transfer transistor TX may have an off-state leakage current under operating voltage of between 0.1 pA/μm and 0.1 nA/μm.

Optionally, both the reset transistor RX and the multiplexed transistor SX/DX may have an off-state leakage current under operating voltage of between 1 pA/μm and 100 nA/μm.

The photodiode PD is configured to sense an incident light signal and convert it into an electrical signal. The transfer transistor TX is configured to transmit the signal from the photodiode PD, and the reset transistor RX is configured to reset the active pixel circuit.

In this embodiment, when the active pixel circuit is to be unselected, the reset voltage signal $V_{RX}$ is set high, turning on (or activating) the reset transistor RX. Moreover, the pass voltage signal $V_{TX}$ is set low, turning off (deactivating) the transfer transistor TX. At the same time, the reference voltage $V_{REF-LOW}$ is applied to the reset transistor RX. At this time, the reference voltage $V_{REF-LOW}$ should be low enough to cause the multiplexed transistor SX/DX to be tuned off (or deactivated). That is, at this time, the multiplexed transistor SX/DX acts like a row select transistor to unselect the active pixel circuit. When the active pixel circuit is to be selected, the pass voltage signal $V_{TX}$ is set high, turning on the transfer transistor TX. As a result, a photoelectric signal converted from an optical signal sensed by the photodiode PD can be output from the transfer transistor TX to cause a rise in potential at the source of the reset transistor RX, which in turn causes the reset transistor RX to be turned off and the multiplexed transistor SX/DX to be turned on (i.e., activated). In this way, the multiplexed transistor SX/DX can function either as a row select transistor that enables the active pixel circuit to be selected, or as a source follower transistor (also known as a voltage buffer or a source follower) that buffers and outputs the signal from the transfer transistor TX, resulting in the presence of a corresponding voltage signal Vout at the output terminal of the active pixel circuit. That is, at this time, the output of the active pixel circuit can be read out.

Optionally, to a node to which the transfer transistor TX and the reset transistor RX are connected, a floating diffusion region (not shown) may be further connected.

In this embodiment, the 3T active pixel circuit may employ a CDS technique for additionally reducing read noise. Specifically, it operates first with the reset transistor RX and the transfer transistor TX being activated to reset the photodiode PD. The transfer transistor TX is then turned off, starting exposure of the photodiode PD and the integration thereof. Moreover, the reset transistor RX is turned off, and the multiplexed transistor SX/DX is turn on. Subsequently, the reset transistor RX is activated, initiating a charging action which raises a potential at the gate of the multiplexed transistor SX/DX to $V_{REF-LOW}$. At the end of the exposure/integration of the photodiode PD, the reset transistor RX is turned off, and the multiplexed transistor SX/DX serves as a source follower transistor to output the signal $V_{REF-LOW}$, accomplishing a first sampling of Vout. Thereafter, the transfer transistor is activated and then turned off, and a photoelectric signal converted from light captured by the photodiode PD is transmitted to the gate of the multiplexed transistor SX/DX. The multiplexed transistor SX/DX again serves as a source follower transistor to output the photoelectric signal, accomplishing a second sampling of Vout. Effective amplitude of the signal can be determined simply by performing a subtraction operation on the two sampled levels to substantially eliminate interference of, for example, fixed-pattern noise from the common readout path and thermal noise introduced by the reset and transfer transistors.

In the 3T active pixel circuit of this embodiment, the high-threshold, low-leakage (i.e., with a low off-state leakage current under operating voltage) characteristics of the transfer transistor can avoid the problem of some electrons flowing from the photodiode into the floating diffusion region. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current (i.e., with a great off-state leakage current under operating voltage) characteristics of the other MOS transistors impart an increased reading speed to the active pixel circuit.

In an alternative embodiment of the present invention, there is provided an active pixel circuit including a transfer transistor TX and a reset transistor RX, which are both chosen as high-threshold, low-leakage MOS transistors, and a multiplexed transistor SX/DX implemented as a low- or regular-threshold, high-on-current MOS transistor. That is, the transfer transistor TX and the reset transistor RX both have a higher threshold voltage and a smaller off-state leakage current under operating voltage than the multiplexed transistor SX/DX, and the multiplexed transistor SX/DX has a smaller on-current than the transfer transistor TX and the reset transistor RX. As an example, the transfer transistor TX and the reset transistor RX may be identical MOS transistors with essentially or exactly the same operating voltage, threshold voltage and off-state leakage current under operating voltage except for only possible slight size differences due to fabrication variations.

This 3T active pixel circuit operates in the same way as the above-discussed one in which only the transfer transistor RX is a high-threshold, low-leakage MOS transistor. The higher threshold voltage and smaller off-state leakage current under operating voltage of the transfer transistor TX and the reset transistor RX in the 3T active pixel circuit can prevent the problem of sampling distortion caused by some electrons following from the photodiode and the reset transistor RX into the floating diffusion region during sampling occurring when both the transfer transistor TX and the reset transistor RX are in an off-state. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current (i.e., with a great off-state leakage current under operating voltage) characteristics of the other MOS transistor impart an increased reading speed to the active pixel circuit.

Additionally, it is to be noted that, in the 3T active pixel circuits in the foregoing embodiments, after the photodiode PD is reset as a result of activating the reset transistor RX and the transfer transistor TX, and prior to the first sampling of Vout, the reset transistor RX is turned off and then activated (i.e., turned on) to effect a charging action for raising the potential at the gate of the multiplexed transistor SX/DX to $V_{REF-LOW}$, followed by again turning off the reset transistor RX. Therefore, the reset transistor RX affects both the read noise and speed of the active pixel circuit. Obviously, compared to the embodiment with only the transfer transistor TX being replaced with a high-threshold, low-leakage transistor, replacing both the transfer transistor TX and the reset transistor RX with high-threshold, low-leakage transistors enables an additional read noise reduction because sampling distortion arising from some electrons flowing from the photodiode and the reset transistor RX into the floating diffusion region during sampling occurring when both the transfer transistor TX and the reset transistor RX are in an off-state can be avoided. However, since the switching speed of the reset transistor RX would affect how fast the multiplexed transistor SX/DX can be activated, a slower reading speed can be expected.

Figure 2:
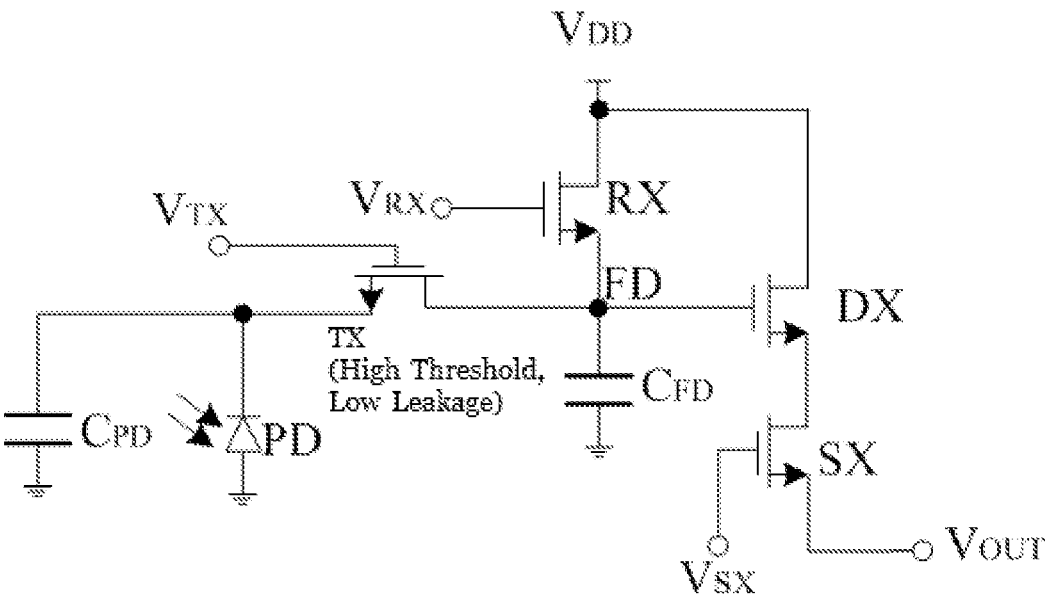
FIG. 2 is a schematic diagram illustrating the structure of an active pixel circuit according to another embodiment of the present invention.

Referring to FIG. 2, in another embodiment of the present invention, there is provided a 4T active pixel circuit having a photodiode PD, a transfer transistor TX, a reset transistor RX, a row select transistor SX and a source follower transistor DX.

In this embodiment, the 4T active pixel circuit further includes a floating diffusion region shown as an equivalent capacitor $C_{FD}$ in FIG. 2. In this figure, parasitic capacitance of the photodiode PD is shown FIG. 2 as an equivalent capacitor $C_{PD}$.

Optionally, the reset transistor RX, the row select transistor SX and the source follower transistor DX may be NMOS transistors. In this case, an anode of the photodiode PD is grounded, and a cathode of the photodiode PD is connected to a source of the transfer transistor TX. A drain of the transfer transistor TX is connected to a source of the reset transistor RX, a gate of the source follower transistor DX and the floating diffusion region (i.e., one end of the capacitor $C_{FD}$) at a floating diffusion node FD. A gate of the transfer transistor TX is connected to a control voltage signal $V_{TX}$, and a drain of the reset transistor RX and a drain of the source follower transistor DX are both connected to an operating voltage signal $V_{DD}$. A source of the source follower transistor DX is connected to a drain of the row select transistor SX, and a gate of the row select transistor SX is connected to a row select voltage signal $V_{SX}$. A source of the row select transistor SX provides a signal output terminal of the 4T active pixel circuit.

The transfer transistor TX is a high-threshold, low-leakage MOS transistor, and the reset transistor RX, the row select transistor SX and the source follower transistor DX are all low-threshold MOS transistors or regular-threshold MOS transistors. That is, the transfer transistor TX has a higher threshold voltage than the reset transistor RX, the row select transistor SX and the source follower transistor DX. The transfer transistor TX has a smaller off-state leakage current under operating voltage than the reset transistor RX, the row select transistor SX and the source follower transistor DX.

As an example, the transfer transistor TX, the reset transistor RX, the row select transistor SX and the source follower transistor DX may all have an operating voltage between 1.62 V and 3.7 V. As an example, the reset transistor RX, the row select transistor SX and the source follower transistor DX may be identical MOS transistors with essentially or exactly the same operating voltage, threshold voltage and off-state leakage current under operating voltage except for only possible slight size differences due to fabrication variations.

Optionally, the transfer transistor TX may have a threshold voltage of between 0.4 V and 1.0 V.

Optionally, the reset transistor RX, the row select transistor SX and the source follower transistor DX may all have a threshold voltage of between 0.2 V and 0.8 V.

Optionally, the transfer transistor TX may have an off-state leakage current under operating voltage of between 0.1 pA/μm and 0.1 nA/μm.

Optionally, the reset transistor RX, the row select transistor SX and the source follower transistor DX may all have an off-state leakage current under operating voltage of between 1 pA/μm and 100 nA/μm.

The photodiode PD is configured to sense an incident light signal and convert it into an electrical signal. The transfer transistor TX is configured to transmit the signal from the photodiode PD, and the reset transistor RX is configured to reset the active pixel circuit. The source follower transistor DX is configured to buffer the signal from the transfer transistor TX, and the row select transistor SX is configured to allow the signal from the source follower transistor DX to be read out.

In this embodiment, the 4T active pixel circuit may employ a CDS technique. Specifically, it operates first with the transfer transistor TX being turned off, starting exposure/integration of the photodiode PD. Moreover, the row select transistor SX and the reset transistor RX are turned on, resetting the floating diffusion node FD. This is equivalent to charging the parasitic capacitance $C_{FD}$. As a result of the charging, a potential at the gate of the source follower transistor DX is raised, turning on the source follower transistor DX. After that, the reset transistor RX is turned off, and a voltage at the floating diffusion node FD is output via the source follower transistor DX, accomplishing a first sampling of $V_{OUT}$. Thereafter, the transfer transistor is turned on and then off, and a photoelectric signal converted from light captured by the photodiode PD is transmitted to the floating diffusion node FD. The voltage at the floating diffusion node FD is again transmitted through the source follower transistor DX, accomplishing a second sampling of $V_{OUT}$. Effective amplitude of the signal can be determined simply by performing a subtraction operation on the two sampled levels to substantially eliminate interference of, for example, fixed-pattern noise from the common readout path and thermal noise introduced by the reset and transfer transistors.

Likewise, in the 4T active pixel circuit in this embodiment, the high-threshold, low-leakage characteristics of the transfer transistor can avoid the problem of some electrons flowing from the photodiode into the floating diffusion region during sampling in an off-state of the transfer transistor. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current characteristics of the other MOS transistors impart an increased reading speed to the active pixel circuit.

In an alternative embodiment of the present invention, there is provided a 4T active pixel circuit including a transfer transistor TX and a reset transistor RX, which are both chosen as high-threshold, low-leakage MOS transistors, and a row select transistor SX and a source follower transistor DX, which are both implemented as low- or regular-threshold, high-on-current MOS transistor. That is, the transfer transistor TX and the reset transistor RX both have a higher threshold voltage and a smaller off-state leakage current under operating voltage than the row select transistor SX and the source follower transistor DX, and the row select transistor SX and the source follower transistor DX both have a greater on-current than the transfer transistor TX and the reset transistor RX. As an example, the transfer transistor TX and the reset transistor RX may be identical MOS transistors with essentially or exactly the same operating voltage, threshold voltage and off-state leakage current under operating voltage except for only possible slight size differences due to fabrication variations. Moreover, the row select transistor SX and the source follower transistor DX may be identical MOS transistors with essentially or exactly the same operating voltage, threshold voltage and off-state leakage current under operating voltage except for only possible slight size differences due to fabrication variations.

In this case, the higher threshold voltage and smaller off-state leakage current under operating voltage of both the transfer transistor TX and the reset transistor RX can prevent the problem of sampling distortion caused by some electrons following from the photodiode and the reset transistor RX into the floating diffusion region during sampling occurring when both the transfer transistor TX and the reset transistor RX are in an off-state. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current (i.e., with a great off-state leakage current under operating voltage) characteristics of the other MOS transistors impart an increased reading speed to the active pixel circuit.

Figure 3:
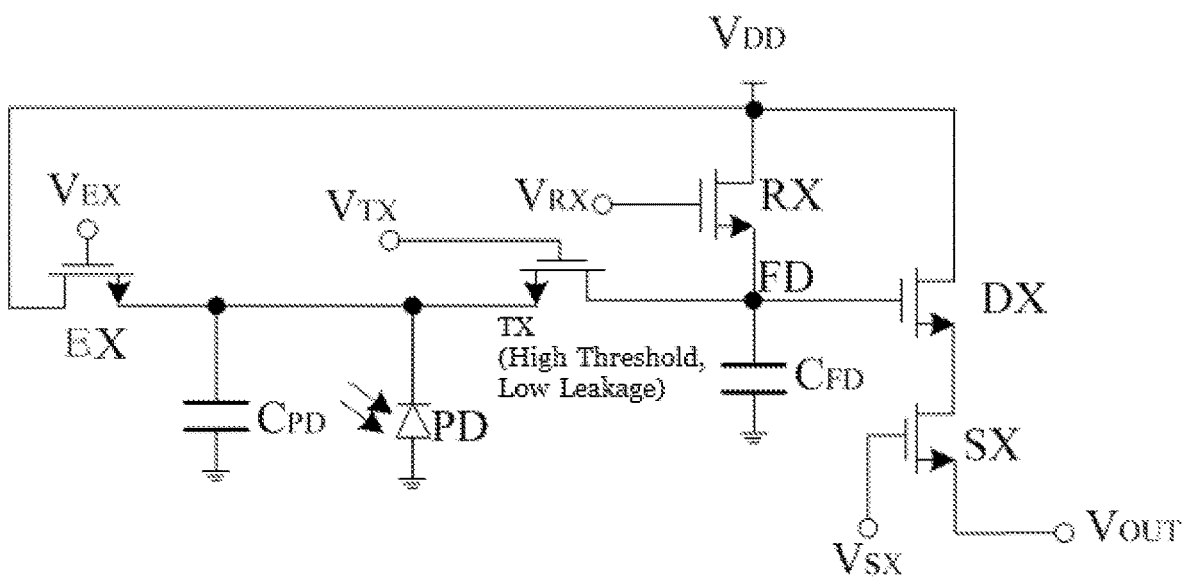
FIG. 3 is a schematic diagram illustrating the structure of an active pixel circuit according to yet another embodiment of the present invention.

Referring to FIG. 3, in another embodiment of the present invention, there is provided a 5T active pixel circuit having a photodiode PD, a transfer transistor TX, a reset transistor RX, a row select transistor SX, a source follower transistor DX and an exposure control transistor EX.

In this embodiment, the 5T active pixel circuit further includes a floating diffusion region shown as an equivalent capacitor $C_{FD}$ in FIG. 3. In this FIG. 3, parasitic capacitance of the photodiode PD is shown as an equivalent capacitor $C_{PD}$.

Optionally, reset transistor RX, the row select transistor SX, the source follower transistor DX and the exposure control transistor EX may be all NMOS transistors. In this case, an anode of the photodiode PD is grounded, and a cathode of the photodiode PD is connected to a source of the transfer transistor TX. A drain of the transfer transistor TX is connected to a source of the reset transistor RX, a gate of the source follower transistor DX and the floating diffusion region (i.e., one end of the capacitor $C_{FD}$) at a floating diffusion node FD. A gate of the transfer transistor TX is connected to a control voltage signal $V_{TX}$, and a drain of the reset transistor RX, a drain of the source follower transistor DX and a drain of the exposure control transistor EX are all connected to an operating voltage signal $V_{DD}$. A source of the source follower transistor DX is connected to a drain of the row select transistor SX, and a gate of the row select transistor SX is connected to a row select voltage signal $V_{SX}$. A source of the row select transistor SX provides a signal output terminal of the 5T active pixel circuit. A source of the exposure control transistor EX is connected to one end of the capacitor $C_{PD}$, and the other end of the capacitor $C_{PD}$ is grounded. A gate of the exposure control transistor EX is connected to an exposure control signal $V_{EX}$.

The transfer transistor TX is a high-threshold, low-leakage MOS transistor, while the exposure control transistor EX, the reset transistor RX, the row select transistor SX and the source follower transistor DX are all low- or regular-threshold MOS transistors. That is, the transfer transistor TX has a higher threshold voltage and a smaller off-state leakage current under operating voltage than the exposure control transistor EX, the reset transistor RX, the row select transistor SX and the source follower transistor DX.

As an example, the transfer transistor TX, the reset transistor RX, the row select transistor SX, the exposure control transistor EX and the source follower transistor DX may all have an operating voltage of 1.62-3.7 V. Moreover, the reset transistor RX, the row select transistor SX, the exposure control transistor EX and the source follower transistor DX may be four identical MOS transistors with essentially or exactly the same operating voltage, threshold voltage and off-state leakage current under operating voltage except for only possible slight size differences due to fabrication variations.

Optionally, the transfer transistor TX may have a threshold voltage of between 0.4 V and 1.0 V.

Optionally, the exposure control transistor EX, the reset transistor RX, the row select transistor SX and the source follower transistor DX may all have a threshold voltage of between 0.2 V and 0.8 V.

Optionally, the transfer transistor TX may have an off-state leakage current under operating voltage of between 0.1 pA/μm and 0.1 nA/μm.

Optionally, the exposure control transistor EX, the reset transistor RX, the row select transistor SX and the source follower transistor DX may all have an off-state leakage current under operating voltage of between 1 pA/μm and 100 nA/μm.

The photodiode PD is configured to sense an incident light signal and convert it into an electrical signal. The transfer transistor TX is configured to transmit the signal from the photodiode PD, and the reset transistor RX is configured to reset the active pixel circuit. The source follower transistor DX is configured to buffer the signal from the transfer transistor TX, and the row select transistor SX is configured to allow the signal from the source follower transistor DX to be read out. The exposure control transistor EX is configured to provide global exposure capabilities.

In this embodiment, the 5T active pixel circuit may also employ a CDS technique, which may operate substantially in the same way as the 4T active pixel circuit detailed above, except for added timing functions for activating and deactivating the exposure control transistor EX. Therefore, it needs not be described in further detail herein.

In the 5T active pixel circuit in this embodiment, the high-threshold, low-leakage characteristics of the transfer transistor can avoid the problem of sampling distortion caused by some electrons flowing from the photodiode into the floating diffusion region during sampling in an off-state of the transfer transistor. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current characteristics of the other MOS transistors impart an increased reading speed to the active pixel circuit. Further, in addition to the CDS technique, the 5T active pixel circuit in this embodiment has an even higher reading speed because of the global exposure capabilities provided by the exposure control transistor EX.

In an alternative embodiment of the present invention, there is provided a 5T active pixel circuit including a transfer transistor TX and a reset transistor RX, which are both chosen as high-threshold, low-leakage MOS transistors, and an exposure control transistor EX, a row select transistor SX and a source follower transistor DX, which are all implemented as low- or regular-threshold, high-on-current MOS transistors. That is, the transfer transistor TX and the reset transistor RX both have a higher threshold voltage and a smaller off-state leakage current under operating voltage than the exposure control transistor EX, the row select transistor SX and the source follower transistor DX, and the exposure control transistor EX, the row select transistor SX and the source follower transistor DX all have a greater on-current than the transfer transistor TX and the reset transistor RX. As an example, the transfer transistor TX and the reset transistor RX may be identical MOS transistors with essentially or exactly the same operating voltage, threshold voltage and off-state leakage current under operating voltage except for only possible slight size differences due to fabrication variations. Moreover, the exposure control transistor EX, the row select transistor SX and the source follower transistor DX may be three identical MOS transistors with essentially or exactly the same operating voltage, threshold voltage and off-state leakage current under operating voltage except for only possible slight size differences due to fabrication variations.

In this case, the higher threshold voltage and smaller off-state leakage current under operating voltage of both the transfer transistor TX and the reset transistor RX can prevent the problem of sampling distortion caused by some electrons following from the photodiode and the reset transistor RX into the floating diffusion region during sampling occurring when both the transfer transistor TX and the reset transistor RX are in an off-state. This can eliminate interference of, for example, fixed-pattern noise from the common readout path in the CDS technique and thermal noise introduced by the reset and transfer transistors and suppress random noise in the sampled levels. In this way, storage distortion of the photodiode and readout distortion of the signal can be reduced, resulting in less read noise and lower power consumption of the active pixel circuit. Moreover, the low-threshold, high-on-current (i.e., with a great off-state leakage current under operating voltage) characteristics of the other MOS transistors impart an increased reading speed to the active pixel circuit.

It is to be noted that the present invention is not limited to the above-discussed 3T, 4T and 5T active pixel circuits, and 6 or more MOS transistors may be included. In each active pixel circuit according to the present invention, all the MOS transistors may be NMOS or PMOS transistors. Alternatively, some of them may be NMOS transistors, and the others may be PMOS transistors. For example, a 5T active pixel circuit may include a reset transistor RX and an exposure control transistor EX, both chosen as PMOS transistors, and other MOS transistors each implemented as an NMOS transistor. The wiring of the two PMOS transistors, i.e., the reset transistor RX and the exposure control transistor EX, may be adapted, compared to the wiring of the NMOS transistors as described above. Additionally, active pixel circuits according to other embodiments of the present invention may operate according to different timing patterns even when they incorporate the same number of transistors (e.g., 4T).

Referring to FIGS. 1 to 3, in embodiments of the present invention, there is also provided an image sensor including a pixel circuit array and a control circuit. The pixel circuit array includes active pixel circuits as shown in at least one of FIGS. 1 to 3.

Embodiments of the present invention also provide an electronic device including an image sensor as defined above.

In summary, the image sensor and the electronic device have improved performance and low-light and high-speed detection capabilities because they incorporate active pixel circuits as described herein.

The description presented above is merely that of a few preferred embodiments of the present invention and does not limit the scope thereof in any sense. Any and all changes and modifications made by those of ordinary skill in the art based on the above teachings are intended to fall within the scope of the present invention.

What is claimed is:

1. An active pixel circuit comprising a photodiode and at least three MOS transistors, at least one of the MOS transistors serving as a transfer transistor, at least another one of the MOS transistors serving as a reset transistor, at least yet another one of the MOS transistors serving as other transistor(s), the transfer transistor connected to the photodiode and configured to transmit a photoelectric signal from the photodiode, the reset transistor connected to a terminal of a respective one of the transfer transistor(s) for outputting the photoelectric signal and configured to reset the active pixel circuit, wherein each transfer transistor has a higher threshold voltage than each other MOS transistor, and each transfer transistor has a smaller off-state leakage current under operating voltage than each other MOS transistor, wherein a threshold voltage of each reset transistor is higher than a threshold voltage of each other MOS transistor and an off-state leakage current under operating voltage of each reset transistor is smaller than an off-state leakage current under operating voltage of each other MOS transistor, or a threshold voltage of each reset transistor is lower than a threshold voltage of each other MOS transistor and an off-state leakage current under operating voltage of each reset transistor is greater than an off-state leakage current under operating voltage of each other MOS transistor.

2. The active pixel circuit of claim 1, wherein at least one of the other MOS transistors serves as a source follower transistor, which is connected to the terminal of the respective transfer transistor for outputting the signal and configured to buffer the signal from the transfer transistor, and/or at least one of the other MOS transistors serves as a row select transistor, which is connected to the source follower transistor and configured to enable the signal from the source follower transistor to be read out.

3. The active pixel circuit of claim 2, wherein the transfer transistor, the reset transistor, the source follower transistor and the row select transistor are all NMOS transistors.

4. The active pixel circuit of claim 3, wherein an anode of the photodiode is grounded, a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, a drain of the reset transistor and a drain of the source follower transistor both connected to an operating voltage signal, a source of the source follower transistor connected to a drain of the row select transistor, a gate of the row select transistor connected to a row select voltage signal and a source of the row select transistor providing a signal output terminal of the active pixel circuit.

5. The active pixel circuit of claim 2, wherein at least one of the other MOS transistors serves as an exposure control transistor, which is connected to the respective transfer transistor and configured to provide global exposure capabilities.

6. The active pixel circuit of claim 5, wherein the transfer transistor, the reset transistor, the source follower transistor, the row select transistor and the exposure control transistor are all NMOS transistors.

7. The active pixel circuit of claim 6, wherein an anode of the photodiode is grounded, a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, drains respectively of the reset transistor, the source follower transistor and the exposure control transistor all connected to an operating voltage signal, a source of the source follower transistor connected to a drain of the row select transistor, a gate of the row select transistor connected to a row select voltage signal, a source of the row select transistor providing a signal output terminal of the active pixel circuit and a gate of the exposure control transistor connected to an exposure control signal.

8. The active pixel circuit of claim 2, wherein the transfer transistor, the reset transistor, the source follower transistor and the row select transistor all have an operating voltage of between 1.62 V and 3.7 V.

9. The active pixel circuit of claim 1, further comprising a floating diffusion region, the floating diffusion region is connected to the terminal of the transfer transistor for outputting the signal and is configured to inductively generate a corresponding voltage signal from an amount of charge output from the transfer transistor.

10. The active pixel circuit of claim 1, wherein the transfer transistor has the threshold voltage of between 0.4 V and 1.0 V, and/or each other MOS transistor has the threshold voltage of between 0.2 V and 0.8 V, wherein the transfer transistor has the off-state leakage current under operating voltage of between 0.1 pA/µm and 0.1 nA/µm, and/or each other transistor has the off-state leakage current under operating voltage of between 1 pA/µm and 100 nA/µm.

11. An image sensor, comprising a pixel array and a control circuit, the pixel array comprising at least one active pixel circuit as defined in claim 1, the control circuit connected to gates of corresponding MOS transistors in each active pixel circuit and configured to turn on or deactivate the corresponding MOS transistors in each active pixel circuit.

12. An active pixel circuit comprising a photodiode and at least three MOS transistors, the at least three MOS transistors comprising at least one first MOS transistor, at least one second MOS transistor, and at least one third MOS transistor, wherein the at least one first MOS transistor serves as a transfer transistor, the transfer transistor connected to both the photodiode and a corresponding third MOS transistor and configured to transmit a photoelectric signal from the photodiode, wherein the at least one third MOS transistors serving as a reset transistor, the reset transistor connected to a terminal of a respective one of the transfer transistor(s) for outputting the photoelectric signal and configured to reset the active pixel circuit, wherein each transfer transistor has a higher threshold voltage than each third MOS transistor, and each transfer transistor has a smaller off-state leakage current under operating voltage than each third MOS transistor, the active pixel circuit employs a correlated double sampling technique, wherein a threshold voltage of each reset transistor is higher than a threshold voltage of each third MOS transistor and an off-state leakage current under operating voltage of each reset transistor is smaller than an off-state leakage current under operating voltage of each third MOS transistor, or a threshold voltage of each reset transistor is lower than a threshold voltage of each transfer transistor and an off-state leakage current under operating voltage of each reset transistor is greater than an off-state leakage current under operating voltage of each transfer transistor.

13. The active pixel circuit of claim 12, wherein at least one of the third MOS transistors serves as a source follower transistor, which is connected to the terminal of the respective transfer transistor for outputting the signal and configured to buffer the signal from the transfer transistor, and/or at least one of the third MOS transistors serves as a row select transistor, which is connected to the source follower transistor and configured to enable the signal from the source follower transistor to be read out.

14. The active pixel circuit of claim 13, wherein an anode of the photodiode is grounded, a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, a drain of the reset transistor and a drain of the source follower transistor both connected to an operating voltage signal, a source of the source follower transistor connected to a drain of the row select transistor, a gate of the row select transistor connected to a row select voltage signal and a source of the row select transistor providing a signal output terminal of the active pixel circuit.

15. The active pixel circuit of claim 13, wherein at least further one of the third MOS transistors serves as an exposure control transistor, which is connected to the respective transfer transistor and configured to provide global exposure capabilities.

16. The active pixel circuit of claim 15, wherein an anode of the photodiode is grounded, a cathode of the photodiode connected to a source of the transfer transistor, a drain of the transfer transistor connected to a source of the reset transistor, a gate of the source follower transistor and a floating diffusion region, a gate of the transfer transistor connected to a control voltage signal, drains respectively of the reset transistor, the source follower transistor and the exposure control transistor all connected to an operating voltage signal, a source of the source follower transistor connected to a drain of the row select transistor, a gate of the row select transistor connected to a row select voltage signal, a source of the row select transistor providing a signal output terminal of the active pixel circuit and a gate of the exposure control transistor connected to an exposure control signal.

17. The active pixel circuit of claim 13, wherein the transfer transistor has the threshold voltage of between 0.4 V and 1.0 V, and/or each third MOS transistor has the threshold voltage of between 0.2 V and 0.8 V.

18. The active pixel circuit of claim 12, further comprising a floating diffusion region, the floating diffusion region is connected to the terminal of the transfer transistor for outputting the signal and is configured to inductively generate a corresponding voltage signal from an amount of charge output from the transfer transistor.

* * * * *